United States Patent
Baillin

(10) Patent No.: US 8,399,299 B2
(45) Date of Patent: Mar. 19, 2013

(54) CAVITY STRUCTURE COMPRISING AN ADHESION INTERFACE COMPOSED OF GETTER MATERIAL

(75) Inventor: Xavier Baillin, Crolles (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 12/899,077

(22) Filed: Oct. 6, 2010

(65) Prior Publication Data

US 2011/0079889 A1   Apr. 7, 2011

(30) Foreign Application Priority Data

Oct. 7, 2009   (FR) ..................... 09 56999

(51) Int. Cl.
*H01L 21/44* (2006.01)
(52) U.S. Cl. .. 438/115; 438/456; 438/476; 257/E21.502
(58) Field of Classification Search .................. 438/115, 438/422, 456, 476
See application file for complete search history.

(56) References Cited

U.S. PATENT DOCUMENTS

| | | | |
|---|---|---|---|
| 4,769,345 | A | 9/1988 | Butt et al. |
| 6,548,889 | B2 | 4/2003 | Saito |
| 6,897,551 | B2 | 5/2005 | Amiotti |
| 6,906,847 | B2 * | 6/2005 | Huibers et al. ............... 359/291 |
| 2002/0063323 | A1 | 5/2002 | Saito |
| 2006/0076634 | A1 | 4/2006 | Palmateer et al. |
| 2009/0001565 | A1 | 1/2009 | Takemoto et al. |
| 2009/0155499 | A1 | 6/2009 | Cooper |
| 2009/0189230 | A1 | 7/2009 | Palmateer et al. |
| 2010/0193215 | A1 | 8/2010 | Baillin |
| 2011/0079425 | A1 | 4/2011 | Baillin et al. |

FOREIGN PATENT DOCUMENTS

| | | |
|---|---|---|
| EP | 1 640 327 A2 | 3/2006 |
| EP | 2 008 966 A2 | 12/2008 |
| FR | 2 922 202 | 4/2009 |
| WO | WO 2009/087284 A1 | 7/2009 |

OTHER PUBLICATIONS

French Preliminary Search Report issued May 28, 2010, in Patent Application No. 0956999 (with Translation of Category of Cited Documents in the attached foreign language Search Report).
U.S. Appl. No. 13/285,289, filed Oct. 31, 2011, Baillin, et al.

* cited by examiner

*Primary Examiner* — Chandra Chaudhari
(74) *Attorney, Agent, or Firm* — Oblon, Spivak, McClelland, Maier & Neustadt, L.L.P.

(57) ABSTRACT

A method for making a structure including at least the steps of: making at least one first portion of at least one getter material against a first substrate or a second substrate, making at least one second portion of at least one getter material against the second substrate when the first portion of getter material is placed against the first substrate, or against the first substrate when the first portion of getter material is placed against the second substrate, and attaching the second substrate to the first substrate by thermocompression of a first part of the first portion of getter material against at least one part of the second portion of getter material, forming at least one cavity delimited by the first substrate and the second substrate, a second part of the first portion of getter material being placed in the cavity.

12 Claims, 3 Drawing Sheets

CAVITY STRUCTURE COMPRISING AN ADHESION INTERFACE COMPOSED OF GETTER MATERIAL

TECHNICAL FIELD

The invention relates to a structure comprising a cavity, for example hermetically sealed, in which a getter material is placed for controlling the atmosphere prevailing in the cavity, the getter material also serving to complete an adhesion interface between the elements forming the cavity. The structure may especially be an encapsulation structure of a microelectronic and/or nanoelectronic device. The invention also relates to a production method for such a structure.

PRIOR ART

For proper operation, some microelectronic and/or nanoelectronic devices such as those of MEMS type (electromechanical microsystem), NEMS (electromechanical nanosystem), MOEMS (opto-electromechanical microsystem), NOEMS (opto-electromechanical nanosystem) or even infrared detectors, need to be enclosed in a cavity whereof the atmosphere (nature of the gas, pressure) is controlled. These devices are generally made collectively on the same substrate (wafer) for example composed of silicon, then encapsulated individually in hermetic cavities made by transfer of covers, generally of silicon, on the substrate, then by hermetic sealing of the covers with the substrate. Hermetic sealing techniques known to date are: anodic sealing between a glass substrate and a silicon cover, metallic eutectic sealing, direct sealing between two silicon elements, and thermocompression between two metallic elements.

Adding getter as a thin layer in the cavity especially controls the pressure prevailing in the cavity. It is known to deposit a getter material as a thin layer inside the cavity, either to the side of the device, or against the cover of the cavity as described in documents U.S. Pat. No. 6,897,551 B2 and WO 2009/087284 A1. Intrinsically and/or due to its microscopic or nanoscopic morphology, a getter material is a material comprising absorbent and/or adsorbent properties vis-à-vis gaseous molecules, which can form a gas pump when it is placed in a closed environment. Such getter material therefore controls the pressure in the cavity in which a microelectronic and/or nanoelectronic device is encapsulated. Non-evaporable getter materials are for example metals such as titanium, zirconium, hafnium, or metallic alloys of these metals or other adapted metals.

FIG. 1 illustrates a first example of an encapsulation structure 10 comprising a substrate 12 enclosing a device 14. The device 14 is encapsulated in a cavity 16 formed between the substrate 12 and a cover 18 which are sealed to one another by a sealing bead 20. A getter material 22 deposited against the cover 18 is also placed in the cavity 16.

The encapsulation structure 10 has two major drawbacks:
 control of the airtightness of the sealing bead 20 after its fusion, which is difficult to obtain,
 the dimensions of the sealing bead 20 which are difficult to control as this bead risks spreading out during the fusion step, possibly causing dysfunctioning of the encapsulated device (affected mobile mass, short-circuit, etc.).

FIG. 2 illustrates a second example of an encapsulation structure 30 comprising the encapsulated device 14 in the cavity 16 formed between the substrate and the cover 18. Compared to the encapsulation structure 10 shown in FIG. 1 in which the cover 18 is attached to the substrate 12 by means of the sealing bead 20, the cover 18 and the substrate 12 of the encapsulation structure 30, which are silicon-based, are sealed directly to each other. In addition to the getter material 22 deposited against the cover 18, the encapsulation structure also comprises in the cavity 16 portions 24 of getter material placed against the substrate 12.

The encapsulation structure 30, which comprises direct assembly between two silicon-based elements, still requires treatment with the aim of improving molecular adhesion at ambient temperature before consolidating the interface via thermal treatment. These treatments, made dry and/or humid, are only slightly compatible with the presence of a getter whereof they risk significantly reducing the pumping capacity and therefore limiting minimal pressure accessible by this type of structure.

EXPLANATION OF THE INVENTION

An aim of the present invention is to propose a novel structure, for example designed to encapsulate a device, to ensure considerable airtightness within a cavity formed in the structure.

For this, a structure is proposed comprising at least one cavity delimited by at least one first substrate and at least one second substrate attached to the first substrate by means of at least one adhesion interface, in which at least one portion of at least one getter material placed in part in the cavity also forms at least one part of the adhesion interface.

It is also proposed a structure comprising at least one cavity delimited by at least one first substrate and at least one second substrate attached to the first substrate by means of at least one adhesion interface, in which a first part of at least one first portion of at least one getter material forms part of the adhesion interface and a second part of the first portion of getter material is placed in the cavity, the first portion of getter material being placed against the first substrate or the second substrate, the adhesion interface further comprising at least one part of a second portion of at least one getter material thermocompressed to the first part of the first portion of getter material, said second portion of getter material being placed against the second substrate when the first portion of getter material is placed against the first substrate or placed against the first substrate when the first portion of getter material is placed against the second substrate.

So the same portion of getter material both forms part of the adhesion interface and forms gaseous absorption and/or adsorption getter within the cavity. Also, when this portion of getter material is placed on the periphery of the cavity, a large getter surface will be all the more easily accessible. Relative to a structure comprising a sealing bead, the sizing of the surface of getter material exposed inside the cavity controls the final pressure prevailing in the cavity.

Given that the two portions of getter materials forming the adhesion interface are thermocompressed to one another, the result is an adhesion interface formed from getter materials having undergone interdiffusion with one another.

A structure is also proposed, comprising at least one hermetically sealed cavity delimited by at least one substrate and at least one cover attached to the substrate by means of at least one adhesion interface, in which at least one portion of at least one getter material placed in part in the cavity also forms at least one part of the adhesion interface.

The second substrate may form a cover.

The cavity may be hermetically sealed.

The first and/or the second portion of getter material may be a thin layer, that is, have a thickness of less than approximately 2 μm.

The adhesion interface may further comprise a portion of the first substrate and/or of the second substrate composed of oxide and/or nitride and/or glass.

The adhesion interface may therefore comprise a portion of getter material in contact:
- with another portion of getter material of the same type or different,
- with a surface (of the first substrate and/or of the second substrate) for example oxidised or nitrided, or glass-based.

The portion of getter material, called first portion of getter material, may be placed against the first substrate or the second substrate, the adhesion interface being able to also comprise at least one part of a second portion of at least one getter material placed against at least one part of the first portion of getter material, said second portion of getter material being able to be placed against the second substrate when the first portion of getter material is placed against the first substrate or placed against the first substrate when the first portion of getter material is placed against the second substrate.

The sealing, for example hermetic, between the first substrate and the second substrate may be obtained by a connection, for example thermocompression, made between two portions of getter materials, for example metallic, and can therefore have considerable airtightness ensuring that the atmosphere obtained in the cavity is prolonged over time. These portions of getter material attached to one other may preferably both be made as thin layers, for example in a thickness of between approximately 100 nm and some hundreds of nanometers, and have a roughness which is all the slighter since the thickness and/or the size of the grains of the getter diminish.

The getter materials of the first and of the second portions of getter material may have different thermal activation temperatures. In this case, the thermal activation temperature of the first portion of getter material may be less than the thermal activation temperature of the second portion of getter material. So, the two portions of getter material, activating thermally at two different temperatures, will reach a higher vacuum in the cavity of the structure than when these portions are composed of getter materials whereof the thermal activation temperatures are similar. In fact, the part of the first portion of getter located inside the cavity will then be exposed to a thermal budget greater than that necessary for its activation, which could result in saturation of said layer and therefore produce a higher vacuum than in the opposite case.

The structure may further comprise at least one first electrical contact placed against and/or in the first substrate, and at least one second electrical contact placed against and/or in the second substrate, the first and the second electrical contacts being able to be connected together electrically at least by means of the parts of the first and of the second portions of getter material forming the adhesion interface. The portions of getter materials forming the adhesion interface thus also form an electric connection electrically linking electrical contacts formed across the structure.

The structure may further comprise a device placed in the cavity. In this way, the structure forms an encapsulation structure of this device.

The structure may further comprise at least one other portion of at least one getter material placed in the cavity, for example placed against the second substrate. This other portion of getter material completes the first portion of getter material forming the adhesion interface and placed in part in the cavity to produce gaseous absorption and/or adsorption in the cavity.

The portion of getter material may be placed against the first substrate or the second substrate by means of at least one first portion of at least one material, for example metallic, suitable for modifying the thermal activation temperature of the portion of getter material, and/or, when the structure comprises a second portion of getter material, the second portion of getter material may be placed respectively against the second substrate or the first substrate by means of at least one second portion of at least one material, for example metallic, suitable for modifying the thermal activation temperature of the second portion of getter material. These portions of adjustment materials of the thermal activation temperature of the getter materials, which are for example made composed of copper or aluminium, especially lower the thermal activation temperature of the portion or portions of getter material, thus limiting the thermal budget seen by the rest of the structure. Also, these adjustment metallic portions of the thermal activation temperature of the getter materials also eliminate chemical interactions which might intervene between the first substrate, or the second substrate, and the getter material of the first and/or of the second portion of getter material. When electrical contacts are formed in the structure and connected together electrically by the portions of getter material, this will preferably produce electrically conductive adjustment portions between the portions of getter material and the electrical contacts.

Said part of the second portion of getter material may be adhered molecularly to the first part of the first portion of getter material.

It is also proposed a production method of a structure comprising at least the steps of:
- making at least one portion of at least one getter material against a first substrate and/or a second substrate,
- attaching the second substrate to the first substrate, forming at least one hermetically sealed cavity delimited by the first substrate and the second substrate, by means of at least one adhesion interface formed at least in part by the portion of getter material, said portion of getter material being also placed in part in the cavity.

It is also proposed a production method of a structure comprising at least the steps of:
- making at least one portion of at least one getter material against a substrate or a cover,
- attaching the cover to the substrate, forming at least one hermetically sealed cavity delimited by the substrate and the cover, by means of at least one adhesion interface formed at least in part by the portion of getter material, said portion of getter material also being placed in part in the cavity.

It is also proposed a production method of a structure comprising at least the steps of:
- making at least one first portion of at least one getter material against a first substrate or a second substrate,
- making at least one second portion of at least one getter material against the second substrate when the first portion of getter material is placed against the first substrate, or against the first substrate when the first portion of getter material is placed against the second substrate,
- attaching the second substrate to the first substrate by thermocompression of a first part of the first portion of getter material against at least one part of the second portion of getter material, forming at least one cavity delimited by the first substrate and the second substrate, a second part of the first portion of getter material being placed in the cavity.

Executing such a thermocompression step to carry out connection of the two substrates has a number of advantages:

no release of gas in the cavity by the getter materials during connection;

good dimensional control of the adhesion interface obtained since thermocompression prevents crushing of the getter materials, contrary to connections involving melting of the getter materials.

The method may further comprise, prior to the step for making the first portion of getter material, a step for making at least one device in and/or against the first substrate such that it is placed in the cavity after attaching the second substrate to the first substrate.

Making the first portion of getter material may comprise at least one step of depositing the first portion of getter material against the first substrate and/or the second substrate as a thin layer.

The method may further comprise, prior to the step for attaching the second substrate to the first substrate, a step for making at least one second portion of at least one getter material against the second substrate when the other portion of getter material, called first portion of getter material, is placed against the first substrate, or placed against the first substrate when the first portion of getter material is placed against the second substrate.

Attaching the second substrate to the first substrate may comprise carrying out at least one thermocompression step of at least one part of the first portion of getter material against at least one part of the second portion of getter material.

Attaching the second substrate to the first substrate may comprise completing adhesion by molecular adhesion of the first part of the first portion of getter material against said part of the second portion of getter material.

In this case, the method may further comprise, after completion of molecular adhesion, a consolidation step via thermal treatment of said molecular adhesion, improving adhesion by molecular adhesion without perturbing the getter material.

Depositing of the first and of the second portion of getter material may be done preferably on minimal thickness (for example equal to approximately 100 nm, or less than approximately 2 μm) by deposit by PVD (physical vapour deposition), for example by cathodic pulverisation or evaporation, so that the portions of getter material have minimal roughness.

The step of making the first or second portion of getter material against the second substrate may also form at least one other portion of getter material against the second substrate such that it is placed in the cavity after attaching the second substrate to the first substrate.

The method may further comprise prior to the step of attaching the second substrate to the first substrate and after the steps of making the first and second portions of getter material, an oxidation and/or nitriding step of the first and/or second portions of getter material which may be implemented in dry atmosphere of dioxygen and/or dinitrogen, capable of forming protective layers composed of oxide and/or nitride of the first and/or of the second portion of getter material, said protective layers being able to be eliminated during carrying out of the connection step. These protective layers thus expose the portions of getter material to the ambient air without it being oxidised or contaminated by air or water vapour present in the air. During assembly carried out at a temperature greater than or equal to the activation temperature of the getter material whereof the activation temperature is the highest, for example between approximately 300° C. and 450° C., the portions of getter material then absorb their protective layer, eliminating accordingly any contact resistance linked to the presence of this protective layer composed of oxide and/or nitride (particularly advantageous when the portions of getter material electrically connect electrical contacts together). Thermocompression made between the portions of getter materials may therefore be completed when the protective layers are eliminated by the action of the pressure applied between the portions of getter material as well as of the temperature to which the portions of getter material are subjected.

The oxidation and/or nitriding step may be conducted for example just after depositing of the getter and in the same machine so as to avoid exposure of the getter material to the ambient air. For a getter deposited for example according to a deposit process via PVD, treatment may be carried out at partial gas pressure (oxygen or nitrogen) compatible with the depositing machine, either at a pressure greater than or equal to approximately $10^{-2}$ mbar, or between approximately 1000 mbar and $10^{-2}$ mbar, and/or at a temperature between approximately 50° C. and 120° C. and/or during a period of between 1 nm and 10 nm approximately. The overriding parameter for carrying out this protection may be temperature, pressure varying over a wide range between approximately 1000 mbar and $10^{-2}$ mbar.

The method may further comprise, between the oxidation and/or nitriding step and the connection step, conducting a thermal treatment step, for example desorption, of the first and/or of the second portion of getter material at a temperature of approximately less than 50° C. to 150° C. relative to the activation temperature of the portion of getter material having the lowest activation temperature, and under secondary vacuum.

The first and the second portions of getter material may be placed respectively against at least one first and one second electrical contact, one of the first and second electrical contacts being able to be placed against and/or in the first substrate and the other of the first and second electrical contacts being able to be placed against and/or in the second substrate, and in which the connection step may electrically connect the first and second electrical contacts together by means of the first and second portions of getter material.

The method may further comprise, prior to the step of making the first portion of getter material, a step of making at least one first portion of at least one material, for example metallic, suitable for modifying the thermal activation temperature of the first portion of getter material, against the first substrate or the second substrate, the first portion of getter material being able to be placed at least on the first portion of said material, and/or, when the method comprises a step of making a second portion of getter material, said method may further comprise, prior to the step of making the second portion of getter material, a step of making at least one second portion of at least one material, for example metallic, suitable for modifying the thermal activation temperature of the second portion of getter material, respectively against the second substrate or the first substrate, the second portion of getter material able to be placed at least on the second metallic portion. To make this portion or these portions of adjustment materials of the activation temperature, it could be advantageous to make use of ductile material and/or material having a low Young's module so as to benefit from its suppleness which could possibly reduce the roughness of the getter material and/or accommodate the residual mechanical constraints caused by assembly in temperature.

The method may further comprise, after attaching the second substrate to the first substrate, one or more thermal activation steps of the getter material or getter materials placed in the cavity.

BRIEF DESCRIPTION OF THE DIAGRAMS

The present invention will be better understood from the description of embodiments given purely by way of indication and non-limiting, with reference to the attached diagrams, in which.

Identical, similar or equivalent parts of the different figures described hereinafter bear the same reference numerals for easy reference to all figures.

The different parts shown in the figures are not necessarily according to a uniform scale, so as to make the figures more legible.

Different possibilities (variants and embodiments) must be understood as not being exclusive to one another and can be combined.

DETAILED EXPLANATION OF PARTICULAR EMBODIMENTS

Figure 1:
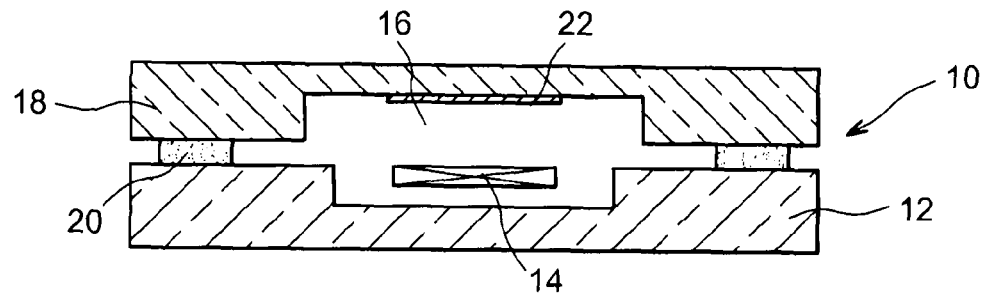
FIGS. 1 and 2 illustrate encapsulation structures of devices of the prior art.
Figure 2:
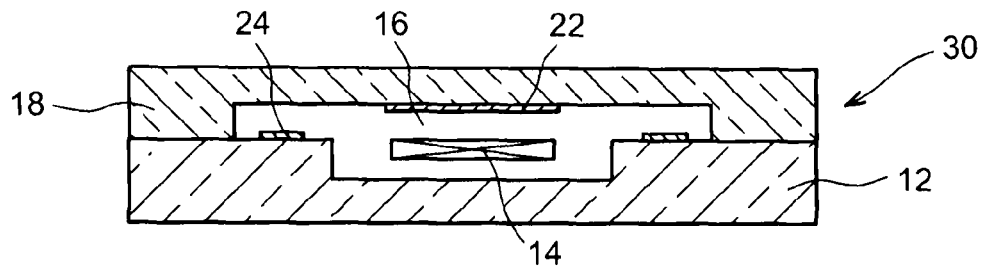
Figure 3:
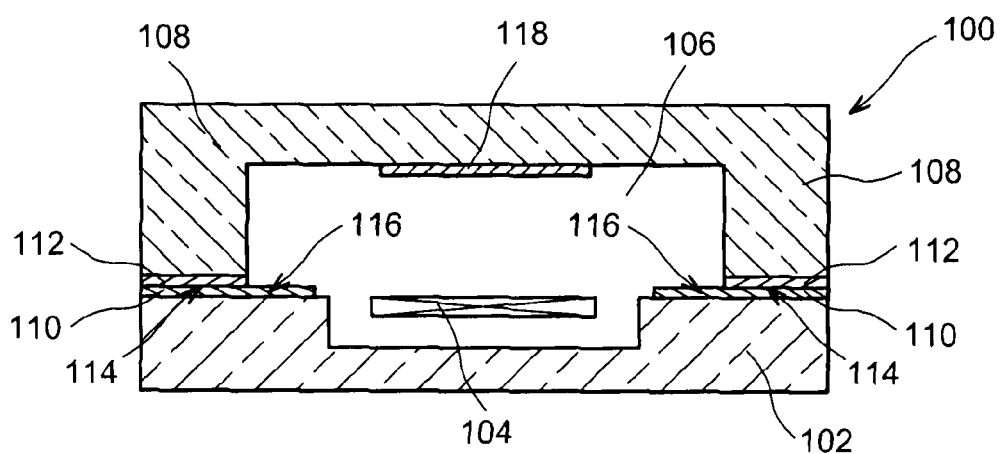
FIGS. 3 and 4 illustrate structures, for example designed to form encapsulation structures of devices respectively according to a first and a second embodiment.

Reference is first made to FIG. 3 which illustrates a structure 100, here acting as encapsulation structure of a device 104, according to a first embodiment.

The structure 100 comprises a first substrate 102, for example composed of a semi-conductor such as silicon, on which the microelectronic and/or nanoelectronic device 104 is placed, for example of MEMS, NEMS, MOEMS, NOEMS type, or an infrared detector, for example of microbolometer type. The device 104 is encapsulated in a cavity 106 formed between the substrate 102 and a second substrate 108, also composed of a semi-conductor such as silicon, here forming a cover. The connection between the second substrate 108 and the first substrate 102 is made by means of a part 114 of a first portion of getter material 110 deposited on the first substrate 102, all over the device 104, and a second portion of getter material 112 deposited against the second substrate 108.

The first and second portions of getter material 110 and 112 have for example a thickness of between approximately 100 nm and 2 μm and are composed of one or more metallic materials, for example titanium and/or zirconium and/or vanadium and/or any other metal having properties of absorption and/or gaseous adsorption.

The adhesion interface between the first substrate 102 and the second substrate 108 is therefore formed by these portions 110, 112 of getter material which have been thermo-compressed against one another. The portions 110, 112 of getter material are here made in the forms of a thin layer, these portions therefore having a thickness less than or equal to approximately 2 μm. Also, these portions 110 and 112 of getter material are deposited here by PVD (physical vapour deposition), for example by cathodic pulverisation or by evaporation, which gives these portions 110 and 112 a slight roughness, making them compatible with thermocompression made between these portions 110 and 112.

FIG. 3 shows that a first part 114 of the first portion 110 of getter material forms with the second portion 112 of getter material the adhesion interface between the first substrate 102 and the second substrate 108, and that a second part 116 of the first portion 110, which is placed in the cavity 106, does not form the adhesion interface. The first portion 110 of getter material therefore acts both to form the adhesion interface between the first substrate 102 and the second substrate 108, as well as of getter material per se, that is, to carry out gaseous absorption and/or adsorption in the cavity 106, thus controlling the atmosphere in this cavity 106. This role of gaseous absorption and/or adsorption filled by the second part 116 of the first portion 110 of getter material is also filled by a portion 118 of getter material placed against the second substrate 118, in the cavity 106 and opposite the device 104, the material of this portion 118 being for example the same as that of the second portion 112 of getter material.

It is possible that the getter materials of portions 110 and 112 are the same in nature or not. Also, it is possible that the getter materials of portions 110 and 112 have the same thermal activation temperature. However, these getter materials are preferably selected such that their thermal activation temperatures are different. Also, these getter materials will preferably be selected such that the getter comprising the lowest thermal activation temperature is the getter material of the portion comprising a part placed in the cavity, that is, the first portion 110 in the example of FIG. 3, which will produce in the cavity 106 a higher vacuum than in the inverse case (getter material of the portion 110 having a thermal activation temperature greater than the thermal activation temperature of the getter material of the portion 112) or in the case where the two portions 110 and 112 of getter materials have the same thermal activation temperature. The thermal activation temperature of the getter materials is for example equal to around 450° C. when the portions 110 and 112 are composed of titanium.

In a variant embodiment, it is possible for the portions of getter material 110 and 112 to not be placed directly against the first substrate 104 and the second substrate 108, but that metallic portions for adjustment of the thermal activation temperature of the getter materials to be placed between these portions 110, 112 and the first substrate 102 and the second substrate 108. These metallic portions, for example composed of Cu and/or Ni and/or Pt and/or Ag and/or Ru and/or Cr and/or Au and/or Al, modulate the temperature to which the portions 110, 112 of getter materials react with the atmosphere of the cavity 106. In this way, it is possible to lower the thermal activation temperatures of the portions 110 and 112 such that they are for example between approximately 275° C. and 425° C. as a function of the nature of the metal of the adjustment metallic portions and of the nature of the getter materials.

The thickness of these metallic portions is for example between approximately 50 nm and 500 nm. These adjustment metallic portions may have a thermal dilation coefficient of between approximately $5.10^{-6}/°$ C. and $23.10^{-6}/°$ C. and a ratio between their working temperature (temperature at which these portions are deposited) and their fusion temperature of substantially between approximately 0.1 and 0.3. The adjustment metallic portions are for example deposited by evaporation. Other characteristics relative to these adjustment portions are described in document WO 2009/087284.

Figure 4:
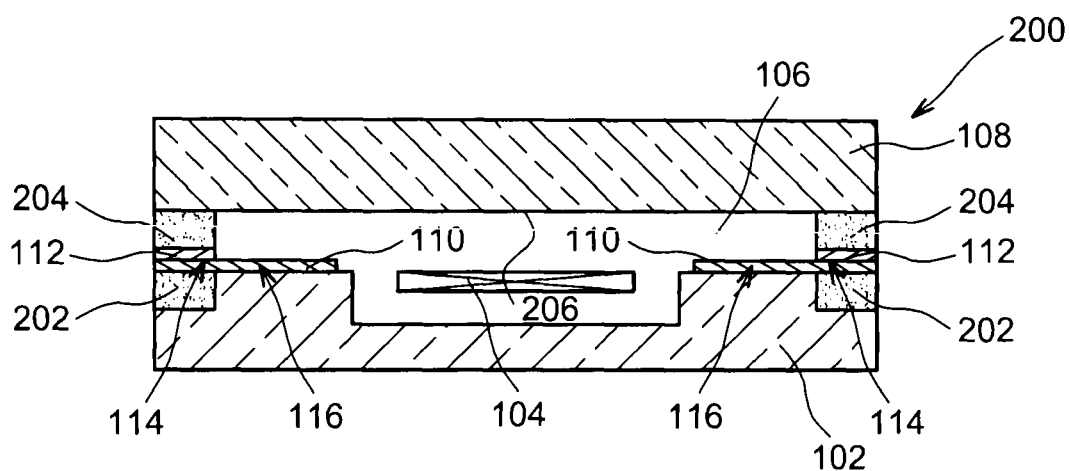

FIG. 4 illustrates a structure 200, here forming an encapsulation structure of the device 104, according to a second embodiment. Relative to the encapsulation structure 100 illustrated in FIG. 3, the encapsulation structure 200 comprises electrical contacts 202 formed in the first substrate 102 as well as electrical contacts 204 placed on a face 206 of the second substrate 108 forming a wall of the cavity 106.

The electrical contacts 202 and 204 are connected together electrically by means portions 110 and 112 of getter materials which are composed of metal. So, the portions 110 and 112 serve both to produce hermetic sealing between the second substrate 108 and the first substrate 102 but also to electrically connect together the electrical contacts 110 and 112. Also, the second part 116 of the first portion 110 of getter material, as in the encapsulation structure 100, also serves to absorb and/or adsorb the gases present in the cavity 106. Finally, relative to the encapsulation structure 100, the encapsulation structure 200 does not comprise the getter material 118.

In a variant, prior to sealing between the portions 110 and 112 of getter materials, it is possible to conduct treatment of the getter materials of portions 110 and 112 so that they are protected from ambient air, and especially from water vapour. For this, dry dioxygen ($O_2$) and/or dry dinitrogen ($N_2$) are injected in-situ, that is, in the deposit chamber of the getter materials, at a temperature between approximately 50° C. and 120° C., and for example equal to approximately 100° C., the pressure prevailing in the deposit chamber being for example between approximately 1000 mbar and a few $10^{-3}$ mbar. By placing the getter material in the presence of dry dioxygen and/or dry dinitrogen over a period of a few minutes, for example between approximately 1 nm and 10 nm, dry oxidation and/or nitriding of the getter materials des portions 110 and 112 take place, forming a protective layer composed of oxide and/or nitride at the surface of the getter materials. In the event of later exposure of the getter material to ambient air, the resulting protective layer protects the getter material from chemical alterations able to be caused by gases present especially in ambient air, as these gases are absorbed and/or adsorbed by the protective layer without polluting the getter material. It is therefore possible to store the first substrate 102 and the second substrate 108 in ambient air before sealing them together hermetically. The other variants previously described in conjunction with the first embodiment (metallic portions for adjustment of the thermal activation temperature of the getter materials, getter materials comprising thermal activation temperatures different or not) may apply to this second embodiment.

The steps of a method for making the encapsulation structure 100 will now be described in conjunction with FIGS. 5A and 5B.

Figure 5A:
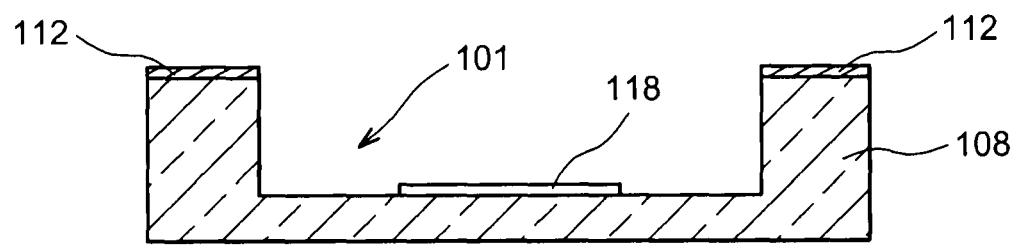
FIGS. 5A and 5B illustrate steps of a production method of a structure according to a particular embodiment.
Figure 5B:
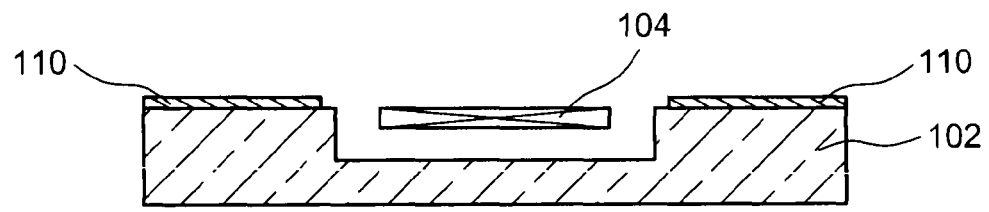

As illustrated in FIG. 5A, the second semi-conductor-based substrate 108 is made first, for example of silicon, in which a hollow 101 is made which will form at least part of the cavity 106. A thin layer of getter material is then deposited onto the second substrate 108, for example by PVD deposit, then formed, for example by photolithography and etching, to form the second portion of getter material 112 around the hollow 101 as well as the portion 118, placed in the hollow 101 and intended to be opposite the device 104. In a variant embodiment, especially when the second substrate has substantial topology, the second portion 112 and the portion 118 could be made directly by lift-off deposit (deposit through a sacrificial mask made on the second substrate 108) or by deposit through a stencil.

The first portion 110 of getter material is then deposited around the device 104 (FIG. 5B), on the first substrate 102 in which the device 104 is made. This first portion 110 of getter material could be made by using techniques similar to those described earlier for making the second portion 112 of getter material.

In a variant, it is possible to first make metallic portions for adjustment of the thermal activation temperature on the first substrate and/or the second substrate, for example by deposit, photolithography and etching, then make the portions of getter materials on these adjustment metallic portions. It is also advantageous to successively deposit the metallic portions and the getter materials, then to form them by photolithography and etching.

Assembly between the first substrate 102 and the second substrate 108 is then carried out for example in a sealing enclosure controlling the atmosphere inside the enclosure and exerting pressure on the first substrate 102 and the second substrate 108 while heating them, resulting in connection by diffusion between the portions 110 and 112 of getter material, hermetically sealing the second substrate 108 to the first substrate 102. This gives the encapsulation structure 100 shown in FIG. 3, with the first part 114 of the first portion 110 of getter material thermocompressed against the second portion 112 of getter material.

Making the encapsulation structure 200 shown in FIG. 4 may comprise conducting steps similar to those described hereinabove for making the encapsulation structure 100.

It is possible to connect the two substrates 102 and 108 via molecular adhesion between the first part 114 of the first portion 110 of getter material and the second portion 112 of getter material.

When a protective layer composed of oxide and/or nitride is deposited on the portions 110 and 112 of getter materials prior to assembly of the second substrate 108 on the first substrate 102, and if the first substrate 102 and/or the second substrate 108 have been exposed to ambient air, a thermal treatment under secondary vacuum is carried out prior to hermetic sealing of the second substrate 108 to the first substrate 102, for example at a temperature equal to approximately 150° C., or more generally less than approximately 50° C. to 150° C. relative to the activation temperature of the getter whereof the activation temperature is the lowest, over a period between approximately 10 nm and 30 nm, to desorb the gases adsorbed and/or absorbed by the protective layer. Next, during sealing, the protective layers disappear under the effect of the pressure exerted between the portions 110 and 112 and of the temperature, then a metal/metal bond forms by diffusion between the portions 110 and 112, hermetically sealing the cavity 106.

Figure 6:
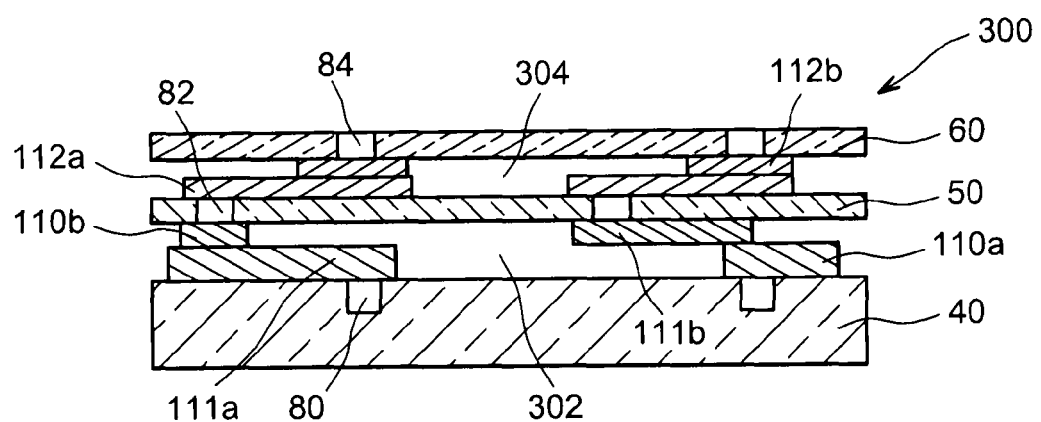
FIG. 6 illustrates a structure according to a third embodiment.

A structure 300 obtained by three-dimensional assembly of three substrates comprising microelectronic and/or nanoelectronic components (for example of CMOS type, sensors, . . . ) referenced 40, 50 and 60, will now be described in conjunction with FIG. 6. Each of the three substrates 40, 50 and 60 comprises vias, or electrical contacts, respectively referenced 80, 82 and 84 and electrically connected together by layers of getter materials 110a, 110b and 112a, 112b also serving to connect the substrates 40, 50 and 60 together. The first substrate 40 here forms a base of the structure 300 and also acts as a grip of the structure 300. The first substrate 40 is for example a substrate comprising devices of CMOS type serving for example to control one or more sensors which are connected to the former, for example via substrates 50 and/or 60. The substrates 50 and 60 may for example be reduced in thickness so as to more easily restore the through electrical contacts. Cavities 302 and 304 are formed respectively between the substrates 40 and 50 and between the substrates 50 and 60. Also, parts 111a, 111b of the layers of getter material 110a, 110b are placed inside the cavity 302.

The getter materials 110a, 110b, 112a and 112b may be of the same nature or not. It is possible for example for the layers of getter material 110a, 110b to have an activation temperature different to that of the layers of getter material 112a, 112b. Also, to adjust the sealings made as a function of the maximum admissible temperature by the stacked substrates but also control the electrical resistance of the interconnections obtained by sealing, it is possible to add to the structure 300 one or more adjustment sub-layers such as described in document WO 2009/087284 A1. For example, if the substrate 60 is sensitive to temperature, a getter activatable at low temperature is preferably selected to make the assembly with the rest of the structure 300. This may result in producing a structure comprising a plurality of substrates connected together electrically.

When the structure 300 comprises one or more adjustment sub-layers, the structure 300 may be made from getter materials whereof the activation temperature decreases further from the base (first substrate 40), thus protecting the upper components from excessive temperature, or inversely, thus increasing diffusion in the getters of lower activation temperature, boosting the solidity of the metal-metal bond.

An example of a method for making the structure 300 will now be described.

Layers of getter material 110a, 110b are first deposited on the substrates 40 and 50. The layers of getter material 110a, 110b are then formed by photolithography and etching of each of these layers. The substrates 40 and 50 are then connected together, for example by thermocompression of the layers of getter material 110a, 110b to one another.

The substrate 50 is then thinned and polished to a thickness compatible with technology known as "Through Silicon Via", or TSV, for connecting the via 80 to the via 82. These steps are then repeated to connect the substrate 60 to the substrate 50 by means of the layers of getter material 112a, 112b, connecting the vias 80 to the vias 84. It is therefore possible to stack a plurality of substrates and make an electrical connection between all the substrates and/or bring the electrical contacts out on either side of the final assembly.

In a variant of the structure 300, it is possible for the assembly between the components not to be made by two layers of getter materials, but by a layer of getter material and a layer of oxide and/or nitride. For this, the layer of getter material 110a is deposited on the substrate 40, this layer of getter material then being formed by photolithography and etching steps. Oxidising of the rear face of the substrate 50 is then carried out, then attaching the layer of getter material 110 to the oxidised rear face of the substrate 50. The substrate 50 is then thinned and polished to a thickness compatible with TSV technology for connecting the via 80 to the via 82. The oxide layer also acts as a stop layer during etching of the silicon to form the trough via 82. The substrate 60 is then assembled on the substrate 50 similarly to assembling of the substrate 50 on the substrate 40, effectively connecting the vias 80 to the vias 84.

Relative to structures of the prior art, during making of the structure 300 the connection step may take place on the scale of the wafer, without the use of brazing or any other process requiring a liquid phase. It is possible to connect a plurality of substrates without having to be concerned with fusing of brazing. In this case, the increase in the thermal budget consolidates the structure 300.

Also, the choice of getter materials adjusts the connection temperature of a substrate on the structure 300 already made, but also the electrical conductivity of the getter material. Finally, the connection is made, followed by a thinning and/or polishing step of the final substrate, such as for example construction of a microdevice.

It is therefore possible to make a three-dimensional stack of similar structures such as substrate, and/or microelectronic components, with the aim of making a device having a plurality of functions, for example for a surface equivalent to that of a single component.

The invention claimed is:

1. A method for making a structure comprising at least the steps of:
    making at least one first portion of at least one getter material against a first substrate or a second substrate,
    making at least one second portion of at least one getter material against the second substrate when the first portion of getter material is placed against the first substrate, or against the first substrate when the first portion of getter material is placed against the second substrate, and
    attaching the second substrate to the first substrate by thermocompression of a first part of the first portion of getter material against at least one part of the second portion of getter material, forming at least one cavity delimited by the first substrate and the second substrate, a second part of the first portion of getter material being placed in the cavity.

2. The method according to claim 1, further comprising, prior to the step for making the first portion of getter material, a step for making at least one device in and/or against the first substrate such that it is placed in the cavity after attaching the second substrate to the first substrate.

3. The method according to claim 1, in which the making of the first portion of getter material comprises at least one step of depositing as a thin layer of the first portion of getter material against the first substrate or the second substrate.

4. The method according to claim 1, in which attaching the second substrate to the first substrate comprises using adhesion by molecular adhesion of the first part of the first portion of getter material against said part of the second portion of getter material.

5. The method according to claim 4, further comprising, after making the molecular adhesion, a connection step by thermal treatment of said molecular adhesion.

6. The method according to claim 1, in which the step for making the first or the second portion of getter material against the second substrate also forms at least one other portion of getter material against the second substrate such that it is placed in the cavity after attaching the second substrate to the first substrate.

7. The method according to claim 5, further comprising prior to the step for attaching the second substrate to the first substrate and after the steps for making the first and of the second portions of getter material, an oxidation and/or nitriding step of the first and/or of the second portions of getter material made under dry atmosphere of dioxygen and/or dinitrogen, forming protective layers composed of oxide and/or nitride of the first and/or of the second portions of getter material, said protective layers being deleted during executing the connection step.

8. The method according to claim 7, in which the oxidation and/or nitriding step is executed at a pressure between approximately 1000 mbar and $10^{-2}$ mbar and/or at a temperature between approximately 50° C. and 120° C. and/or over a period between approximately 1 min and 10 min.

9. The method according to claim 7, further comprising, between the oxidation and/or nitriding step and the connection step, conducting a step of thermal treatment of the first and/or of the second portions of getter material at a temperature less than approximately 50° C. to 150° C. relative to the activation temperature of the portion of getter material whereof the activation temperature is the lowest, and under secondary vacuum.

10. The method according to claim 5, in which the first and the second portion of getter material are made respectively against at least a first and a second electrical contacts, one of the first and second electrical contacts being placed against and/or in the first substrate and the other of the first and second electrical contacts being placed against and/or in the second substrate, and in which the connection step electrically connects together the first and second electrical contacts by means of the first and of the second portions of getter material.

11. The method according to claim 1, further comprising, prior to the step for making the first portion of getter material, a step for making at least one first portion of at least one material suitable for modifying the thermal activation temperature of the first portion of getter material, against the first substrate or the second substrate, the first portion of getter material being made at least on the first portion of said material, and/or said method further comprises, prior to the step for making the second portion of getter material, a step for making at least one second portion of at least one material suitable for modifying the thermal activation temperature of the second portion of getter material, respectively against the second substrate or the first substrate, the second portion of getter material being made at least on the second portion of said material.

12. The method according to claim 1, further comprising, after attaching the second substrate to the first substrate, one or more thermal activation steps of the getter material or of the getter materials placed in the cavity.

* * * * *